United States Patent
Chen et al.

(10) Patent No.: US 9,847,364 B2
(45) Date of Patent: Dec. 19, 2017

(54) IMAGE SENSOR DEVICES AND DESIGN AND MANUFACTURING METHODS THEREOF

(71) Applicant: Taiwan Semiconductor Manufacturing Company, Ltd., Hsin-Chu (TW)

(72) Inventors: Chun-Han Chen, Changhua (TW); Szu-Ying Chen, Toufen Township (TW); Dun-Nian Yaung, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/464,269

(22) Filed: Aug. 20, 2014

(65) Prior Publication Data

US 2016/0056197 A1   Feb. 25, 2016

(51) Int. Cl.
*H01L 27/14* (2006.01)
*H01L 27/148* (2006.01)
*H01L 27/146* (2006.01)
*H01L 23/532* (2006.01)
*H01L 23/498* (2006.01)
*H01L 21/768* (2006.01)

(52) U.S. Cl.
CPC .... *H01L 27/14636* (2013.01); *H01L 27/1464* (2013.01); *H01L 27/14687* (2013.01); *H01L 21/76898* (2013.01); *H01L 23/49827* (2013.01); *H01L 23/53223* (2013.01); *H01L 23/53238* (2013.01)

(58) Field of Classification Search
CPC ......... H01L 27/14636; H01L 27/14687; H01L 27/1464; H01L 21/76898; H01L 23/49827; H01L 23/53223; H01L 23/53238; H01L 23/53266; H01L 23/5384
See application file for complete search history.

(56) References Cited

U.S. PATENT DOCUMENTS

| | | | | |
|---|---|---|---|---|
| 2012/0001286 A1* | 1/2012 | Yoon | ................. | H01L 27/14618 257/432 |
| 2013/0248862 A1* | 9/2013 | Inoue | .................. | H01L 31/0224 257/48 |
| 2014/0077063 A1* | 3/2014 | Cho | ................... | H01L 27/14618 250/208.1 |
| 2014/0131828 A1* | 5/2014 | Isono | ................ | H01L 27/14636 257/459 |

* cited by examiner

*Primary Examiner* — Su C Kim
(74) *Attorney, Agent, or Firm* — Slater Matsil, LLP

(57) ABSTRACT

Image sensor devices, design methods thereof, and manufacturing methods thereof are disclosed. In some embodiments, a design method for an image sensor device includes providing an initial design for an image sensor device. The initial design includes a pixel array region and a through-via region disposed proximate the pixel array region. The initial design has a first length between the pixel array region and the through-via region. The initial design has a second length that is a width of the through-via region. The design method includes analyzing a ratio of the second length and the first length, and modifying the initial design to achieve an optimal ratio of the second length and the first length.

20 Claims, 7 Drawing Sheets

IMAGE SENSOR DEVICES AND DESIGN AND MANUFACTURING METHODS THEREOF

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon.

Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging, for example. Integrated circuit dies are typically formed on a front side of semiconductor wafers. The integrated circuit dies may comprise various electronic components, such as transistors, diodes, resistors, capacitors, and other devices. The integrated circuit dies may comprise various functions, such as logic, memory, processors, and/or other functions.

Complementary metal oxide semiconductor (CMOS) image sensors are used in cameras, cell phones, and other electronic devices for capturing images. Back side illumination (BSI) image sensors are CMOS image sensors in which light enters from a back side of a substrate, rather than the front side. BSI sensors are capable of capturing more of an image signal than front side illumination sensors due to a reduced reflection of light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
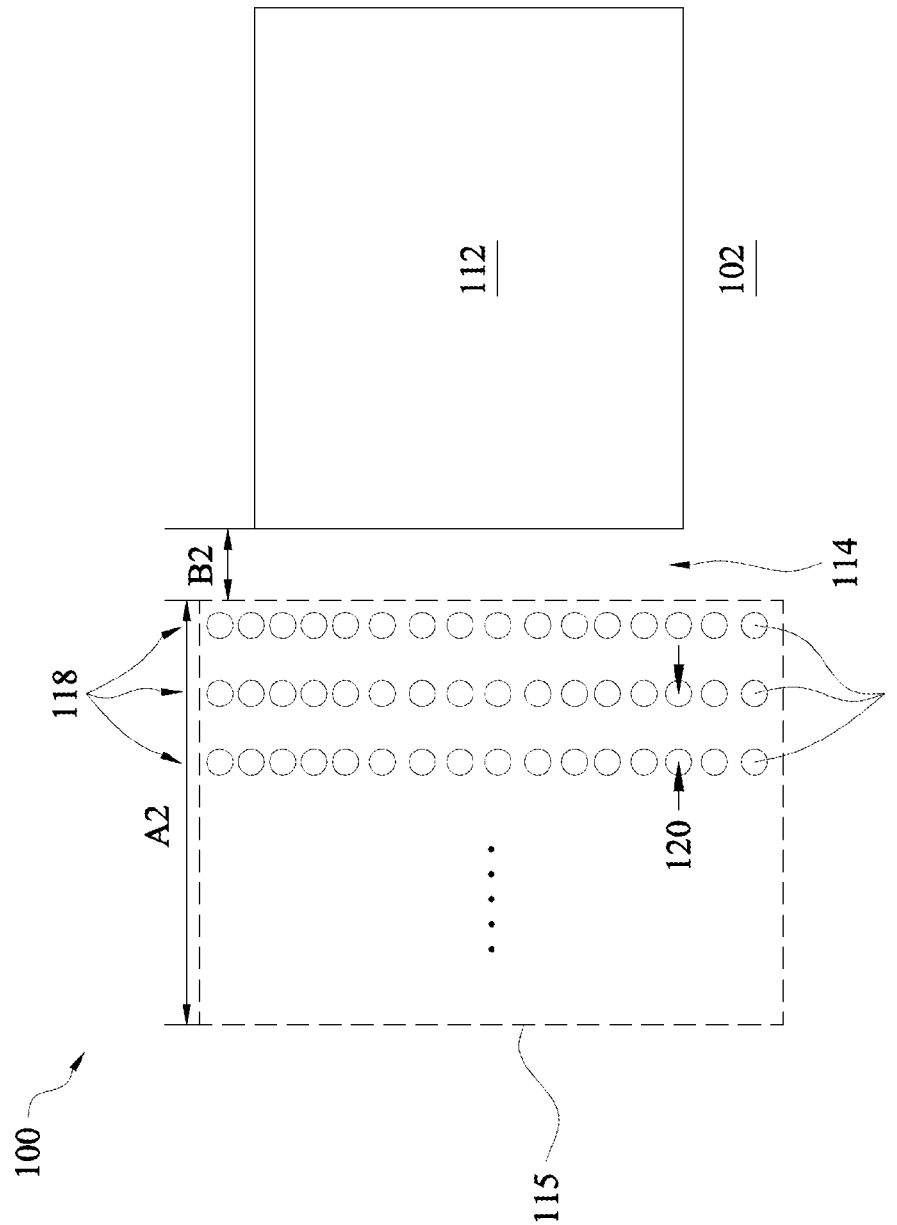
FIGS. 1 through 5 are top views illustrating image sensor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure include novel image sensor devices, design methods for image sensor devices, and methods of manufacturing image sensor devices. Novel image sensor devices are disclosed herein wherein a ratio of a length of a through-via region to a length of a keep-out zone (KOZ) between the through-via region and a pixel array region is optimized, in order to avoid deleterious effects of thermal stress from the through-vias on the image sensor devices, to be described further herein.

FIGS. 1 through 5 are top views illustrating image sensor devices 100 in accordance with some embodiments of the present disclosure. Referring first to FIG. 1, there is shown an image sensor device 100 in accordance with some embodiments. The image sensor device 100 includes a pixel array region 112 disposed over a substrate 102 and a through-via region 115 disposed over the substrate 102. The through-via region 115 is disposed proximate the pixel array region 112. The pixel array region 112 includes a plurality of pixels formed therein, not shown. The pixel array region 112 comprises a plurality of photodiodes formed therein that are arranged in an array of a plurality of rows and a plurality of columns, for example (see photodiodes 130 shown in FIG. 6), in some embodiments. The pixels and/or photodiodes in the pixel array region 112 are adapted to sense, capture, and reproduce images captured by the image sensor device 100, for example.

The through-via region 115 includes a plurality of through-vias 110 formed therein. The through-vias 110 are arranged in a plurality of columns 118 and/or a plurality of rows and/or columns 118 in some embodiments, for example. The through-vias 110 may comprise a conductive material such as copper, a copper alloy, other metals, or combinations or multiple layers thereof, for example. The through-vias 110 comprise through-oxide vias (TOVs) in some embodiments, for example. The through-vias 110 may comprise TOVs formed in one or more oxide or insulating material layers of the image sensor device 100 in some embodiments, for example. In other embodiments, the through-vias 110 are lined with an insulating material or an oxide material (not shown) and are then filled with a conductive material, as another example. The through-vias 110 provide vertical electrical connections for the image sensor device 100 in some embodiments, for example.

Note that only a portion of an image sensor device 100 is shown in the drawings of the present disclosure; however, the image sensor devices 100 illustrated herein may also include other elements, regions, and devices, such as one or more periphery regions that include peripheral components such as transistors, resistors, inductors, capacitors, and other devices, not shown, for example.

The through-vias 110 in the through-via region 115 each comprise a width in the top view of about 0.25 µm to about 5 µm some embodiments, for example. The through-vias 110 in the through-via region 115 comprise a pitch 120 of about 0.5 µm to about 10 µm some embodiments, for example. The pitch 120 of the through-vias 110 comprises a center-to-center spacing of the through-vias 110 or a center-to-center distance between the through-vias 110, for example. Each of the plurality of through-vias 110 comprises a pitch 120 from a center of the through-via 110 to an adjacent one of the plurality of through-vias 100, for example. The through-vias 110 in the through-via region 115 may be arranged in one or more columns 118.

In some embodiments, the through-vias 110 in the through-via region 115 are arranged in a plurality of columns 118, for example. The number of columns 118 of the through-vias 110 in the through-via region 115 comprises about 2 to about 10 in some embodiments. Alternatively, the through-vias 110 in the through-via region 115 may comprise other dimensions, relative dimensions, arrangements, and numbers of columns 118 or rows.

The through-via region 115 comprises a length A2 which comprises a width of the through-via region 115 in some embodiments. The length A2 of the through-via region 115 comprises the number of columns 118 times the pitch 120 of the through-vias 110 in the through-via region 115 in some embodiments, for example. The length A2 of the through-via region 115 comprises about 3 µm to about 200 µm some embodiments, for example. Alternatively, the length A2 of the through-via region 115 may comprise other dimensions.

The length B2 between the pixel array region 112 and the through-via region 115 comprises about 1 µm to about 150 µm some embodiments, for example. Alternatively, the length B2 may comprise other dimensions. The length B2 comprises a length of a keep-out zone (KOZ) in some embodiments, wherein no through-vias 110 are disposed in the KOZ, for example. The length B2 comprises a width or spacing between an edge of the pixel array region 112 and an edge of the through-via region 115, for example. The length B2 comprises a KOZ length in some embodiments. The length B2 comprises a width of an intermediate region 114 that is disposed between the pixel array region 112 and the through-via region 115 in some embodiments, as another example. The intermediate region 114 comprise a KOZ in some embodiments, for example.

The length B2 is also referred to herein (e.g., in some of the claims) as a first length, and the length A2 is also referred to herein as a second length. In accordance with some embodiments of the present disclosure, the length B2, the length A2, or both the lengths B2 and A2 are selected to achieve a ratio of A2/B2 of about 0.2 to about 0.8. The ratio of A2/B2 of about 0.2 to about 0.8 is expressed in arbitrary units (a.u.), for example. The ratio of A2/B2 of about 0.2 to about 0.8 a.u. is advantageously sufficient to achieve improved performance for the image sensor device 100 and also to avoid thermal stress from the through-vias 110 in the through-via region 115 from impacting performance of the image sensor device 100. The ratio of A2/B2 of about 0.2 to about 0.8 a.u. prevents or reduces thermal stress from the through-vias 110 in the through-via region 115 from negatively impacting performance of photodiodes in the pixel array region 112, for example.

In the embodiments shown in FIG. 1, the through-via region 115 is disposed along one side of the pixel array region 112. The through-via region 115 is disposed along the left side of the pixel array region 112 in the embodiments shown in FIG. 1, for example. Alternatively, the through-via region 115 may be disposed along the top side of the pixel array region 112, the right side of the pixel array region 112, and/or the bottom side of the pixel array region 112.

Figure 2:
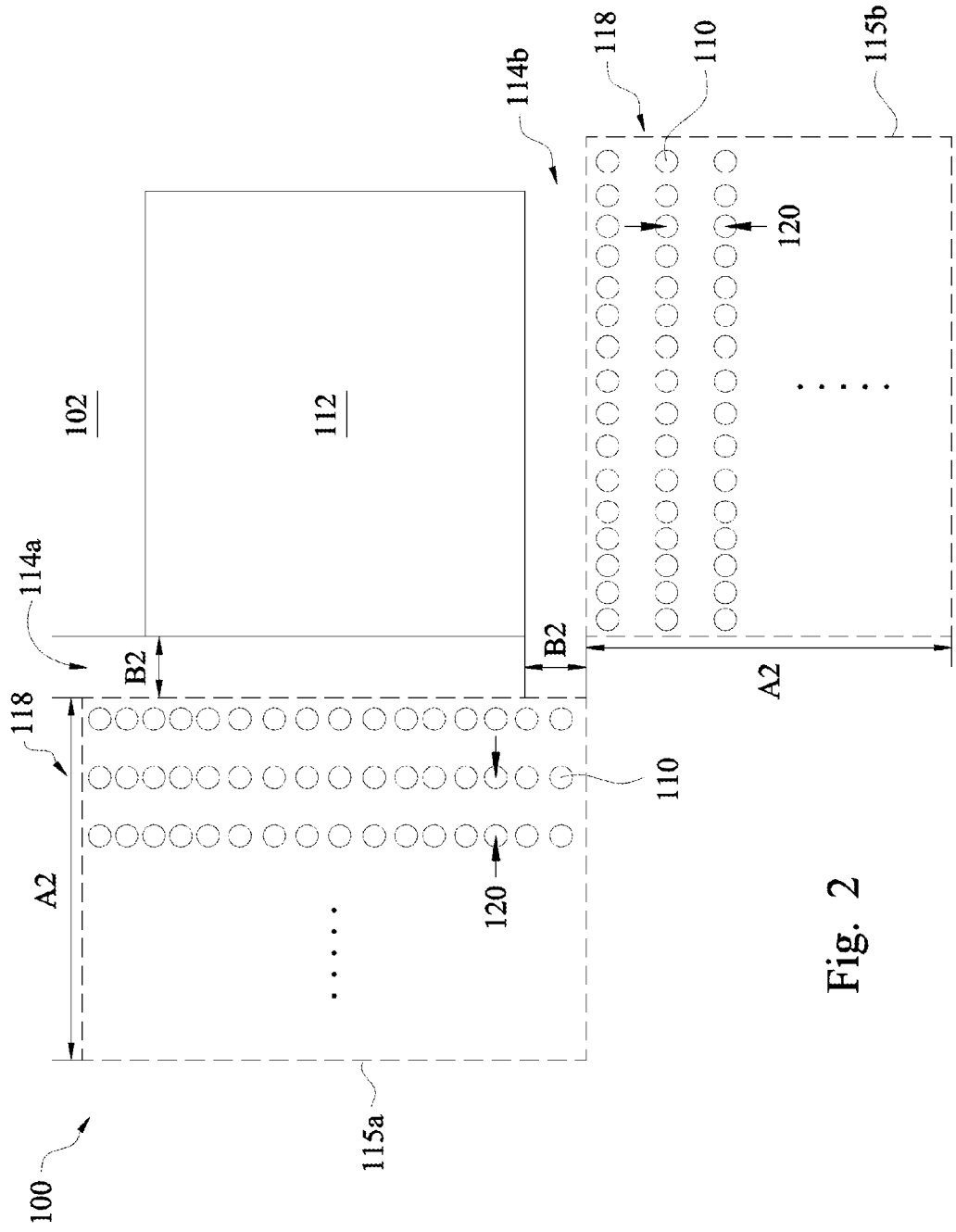
Figure 3:
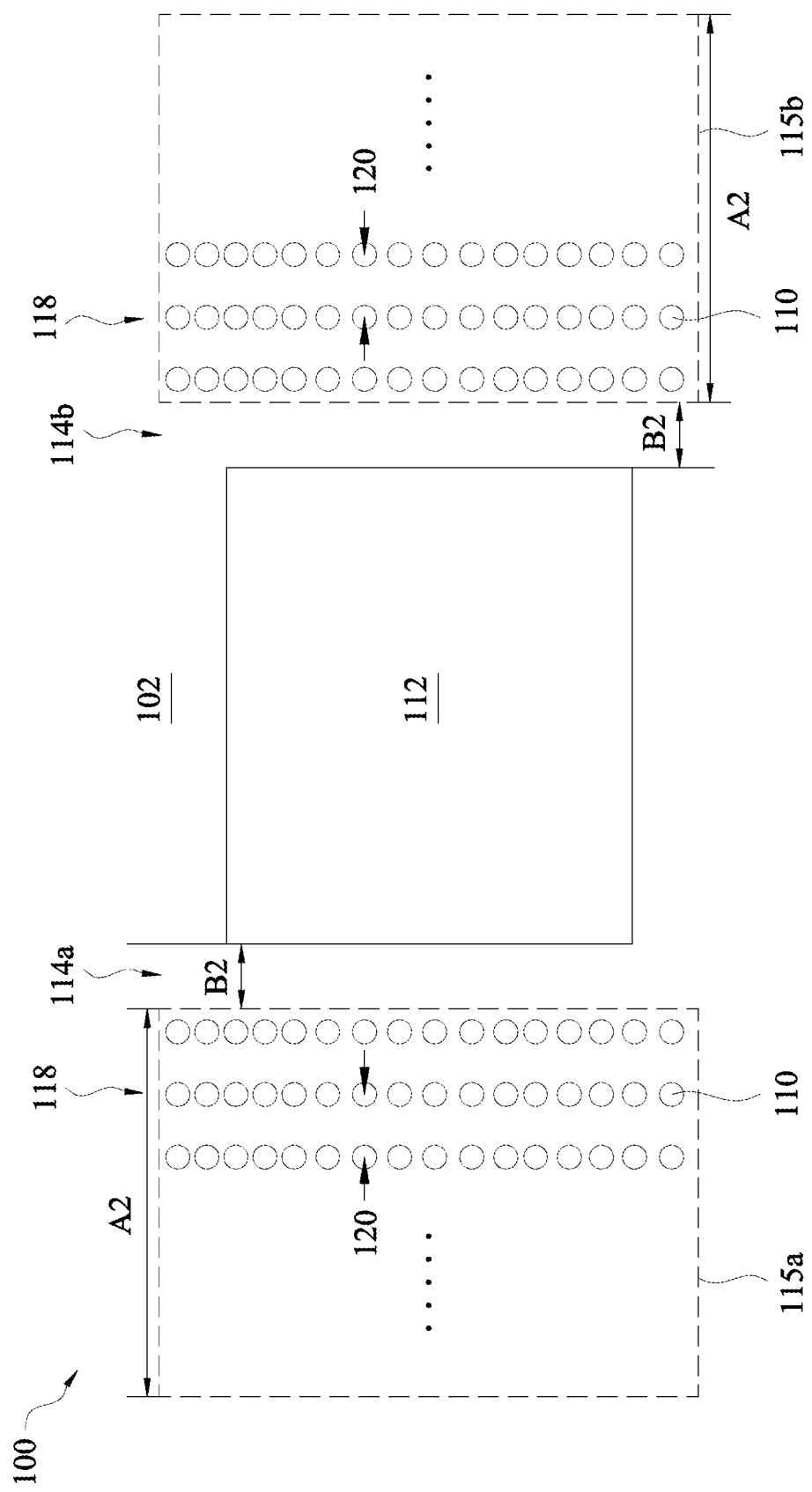

In other embodiments, a through-via region 115 is disposed along a plurality of sides of the pixel array region 112. For example, FIG. 2 is a top view illustrating some embodiments of the present disclosure, wherein a through-via region 115a is disposed over the substrate 102 proximate a first side of the pixel array region 112, and a through-via region 115b is disposed over the substrate 102 proximate a second side of the pixel array region 112. The through-via region 115a is disposed proximate a left side of the pixel array region 112, and the through-via region 115b is disposed proximate a bottom side of the pixel array region 112 in FIG. 2, for example. Alternatively, a through-via region 115b may be disposed proximate a right side of the pixel array region 112, as shown in FIG. 3, or a through-via region 115b may be disposed proximate a top side of the pixel array region 112 (not shown), in other embodiments.

In embodiments wherein a plurality of through-via regions 115a and 115b are disposed proximate two or more sides of the pixel array region 112, dimensions of lengths A2, lengths B2, or both lengths A2 and B2 are selected and/or chosen such that the ratio of A2/B2 ranges from about 0.2 to about 0.8 a.u., in accordance with some embodiments. The length A2 of the through-via region 115a may be substantially the same as the length A2 of the through-via region 115b in some embodiments. Alternatively, the length A2 of the through-via region 115a may be different than the length A2 of the through-via region 115b in some embodiments. Likewise, the length B2 of the intermediate region 114a may be substantially the same as the length B2 of the intermediate region 114b, or the length B2 of the intermediate region 114a may be different than the length B2 of the intermediate 114b in some embodiments.

Figure 4:
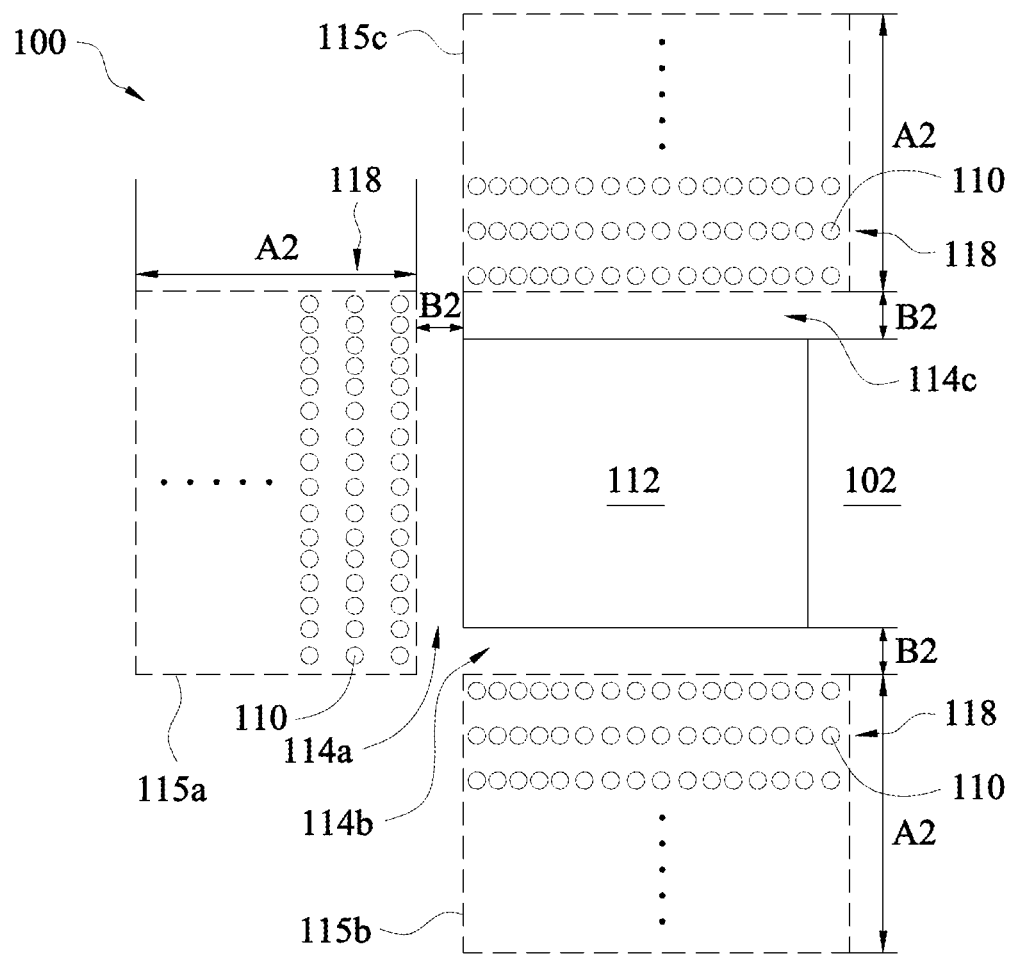

FIG. 4 is a top view illustrating an image sensor device 100 in accordance with some embodiments, wherein through-via regions 115a, 115b, and 115c are disposed proximate three sides of the pixel array region 112. The ratio A2/B2 is analyzed for each of the through-via regions 115a, 115b, and 115c, and lengths A2, B2, or both A2 and B2 are selected to achieve the ratios previously described herein. The ratios A2/B2 may be the same, or different, for each of the through-via regions 115a, 115b, and 115c. A through-via region 115a, 115b, and/or 115c is disposed along each of a plurality of sides of the pixel array region 112.

Figure 5:
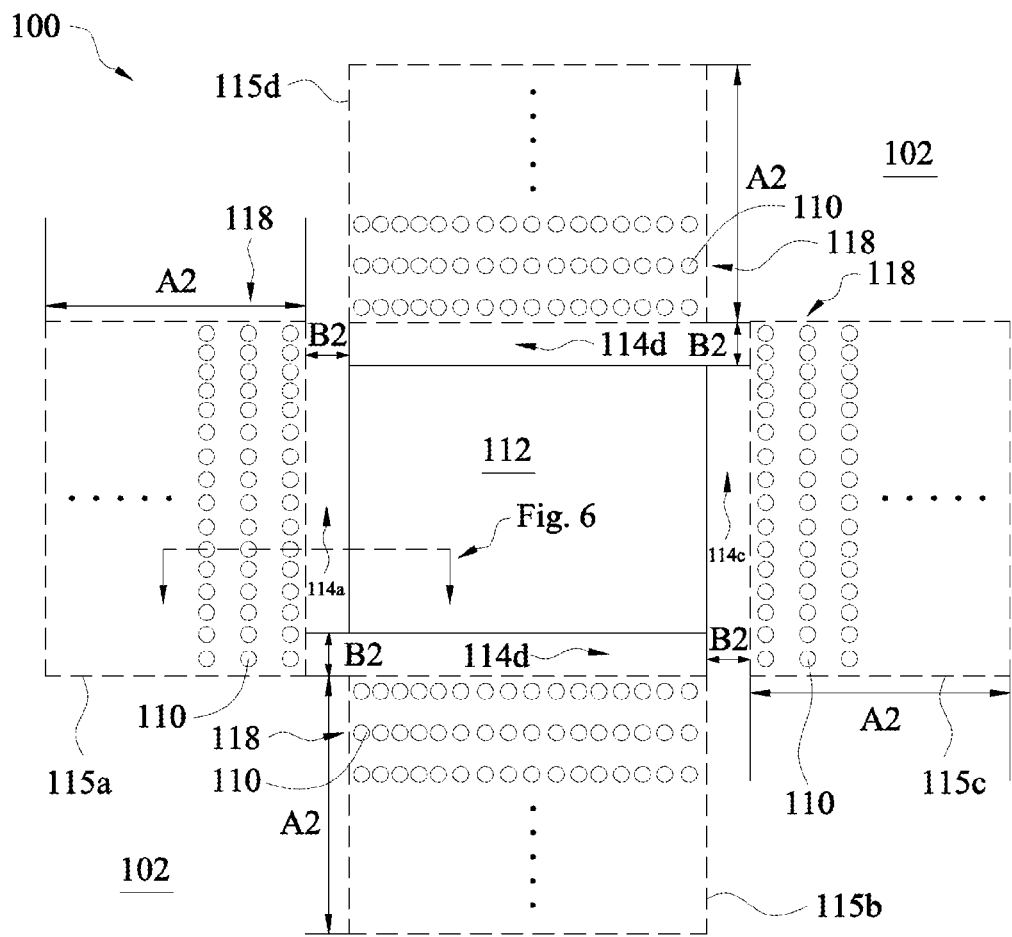

In some embodiments, a through-via region 115a, 115b, 115c, and 115d is disposed along all sides of the pixel array region 112, as shown in FIG. 5 in a top view. The ratio A2/B2 is analyzed for each of the through-via regions 115a, 115b, 115c, and 115d, and lengths A2, B2, or both A2 and B2 are selected or modified to achieve the ratios previously described herein.

In some embodiments, an analysis of the ratio A2/B2 determines that lengths A2 and B2 are within a desired relative range of from about 0.2 to about 0.8 a.u., and lengths A2 and B2 are not required to be modified.

Figure 6:
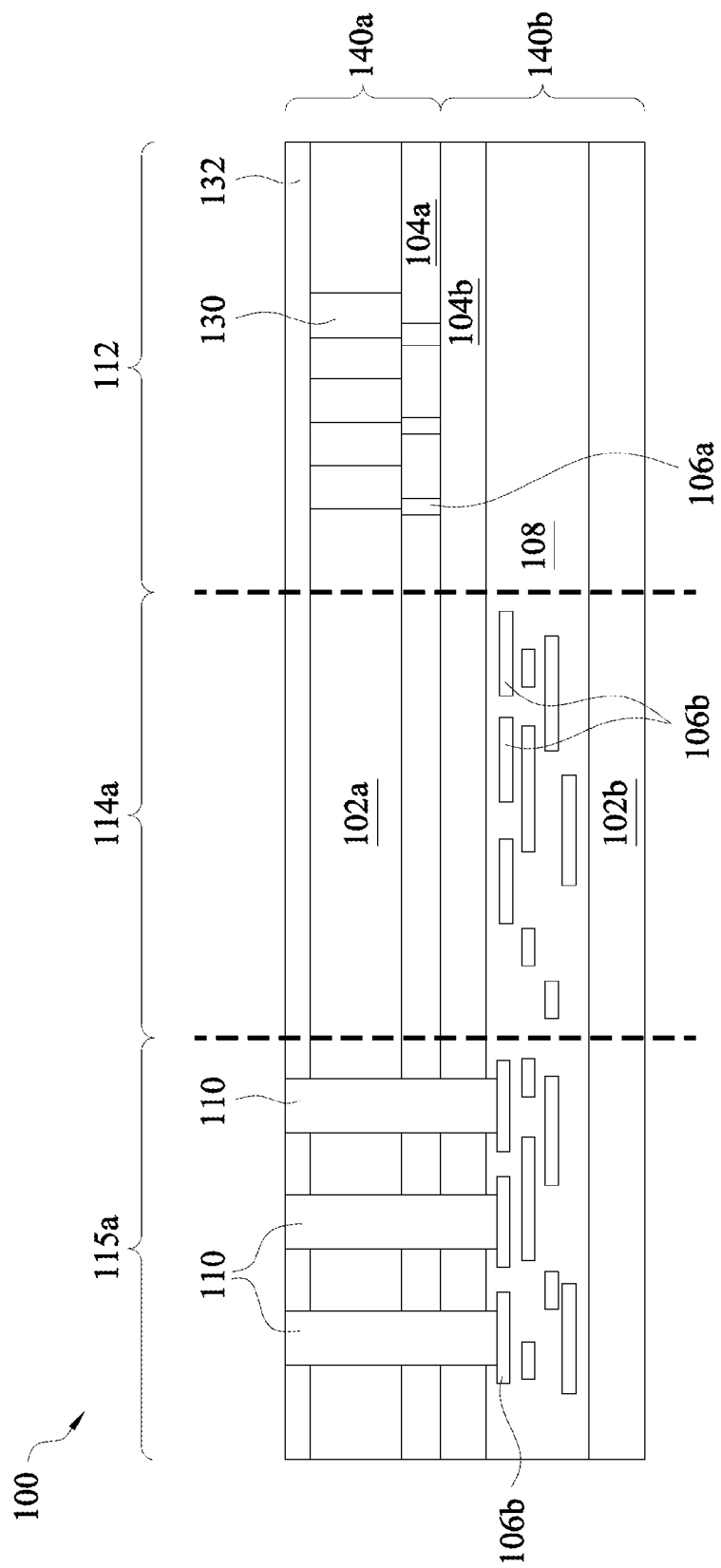
FIG. 6 is a cross-sectional view illustrating an image sensor device in accordance with some embodiments.

FIG. 6 is a cross-sectional view illustrating an image sensor device 100 in accordance with some embodiments. A cross-sectional view of a portion of the top view of FIG. 5 is shown in FIG. 6. A plurality of through-vias 110 is illustrated in the through-via region 115a. The plurality of through-vias 110 is arranged in a plurality of rows and a plurality of columns. An intermediate region 114a is disposed between the pixel array region 112 and the through-via region 115a. No through-vias 110 are formed in the intermediate region 114a which comprises a KOZ in some embodiments. A plurality of pixels or photodiodes 130 is disposed in the pixel array region 112.

FIG. 6 also illustrates that an image sensor device 100 may include two or more wafers 140a and 140b that are bonded together. Wafer 140a includes the through-vias 110 and the photodiodes 130. A plurality of the photodiodes 130 is arranged in an array in the pixel array region 112, in some embodiments.

The wafer 140a comprises a first substrate 102a. The first substrate 102a may include a semiconductor substrate comprising silicon or other semiconductor materials and may be covered by an insulating layer, for example. The first substrate 102a may also include other active components or circuits, not shown. The substrate 102a may comprise silicon oxide over single-crystal silicon, for example. Compound semiconductors, GaAs, InP, Si/Ge, or SiC, as examples, may be used in place of silicon. The first substrate 102a may comprise a silicon-on-insulator (SOI) or a germanium-on-insulator (GOI) substrate, as examples. The first substrate 102a may include a variety of electrical circuits and/or devices formed thereon. The electrical circuits formed on the first substrate 102a may be any type of circuitry suitable for a particular application. In accordance with some embodiments, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like.

The wafer 140a includes a first inter-metal dielectric (IMD) layer 104a disposed on the first substrate 102a. The first IMD layer 104a includes one or more insulating material layers and may include conductive features 106a formed therein (see the conductive features 106a coupled to the photodiodes 130). An insulating material layer 132 may be formed over a back side of the image sensor 100 device, over the first substrate 102a. The wafer 140a may comprise a pixel array wafer in some embodiments, for example.

The first IMD layer 104a comprises a plurality of insulating material layers that include a plurality of conductive features 106a. The conductive features 106a may comprise a plurality of conductive lines and conductive vias, as examples. The insulating material layers of the first IMD layer 104a may comprise silicon dioxide, silicon nitride, low dielectric constant (k) insulating materials having a dielectric constant or k value less than silicon dioxide (e.g., a k value of about 3.9 or less), extra-low k (ELK) dielectric materials having a k value of about 3.0 or less, or other types of materials, as examples. The conductive features 106a may comprise materials such as Cu, Al, alloys thereof, seed layers, and/or barrier layers formed using damascene and/or subtractive etch processes, as examples. Alternatively, the first IMD layer 104a and conductive features 106a may comprise other materials and may be formed using other methods.

The wafer 140b comprises a second substrate 102b and a second IMD layer 104b disposed on the second substrate 102b. The second substrate 102b and the second IMD layer 104b may comprise similar materials as described for the first substrate 102a and the first IMD layer 104a, for example. An interconnect structure 108 may be formed over the second substrate 102b between the second substrate 102b and the second IMD layer 104b. The interconnect structure 108 may alternatively be a part of the second IMD layer 104b, for example. The interconnect structure 108 may comprise a plurality of insulating material layers with conductive features 106b formed therein, for example.

The wafers 140a and 140b may be bonded together using a hybrid bonding method, oxide-to-oxide bonds, metal-to-metal bonds, other methods, or combinations thereof, as examples. The IMD layers 104a and 104b of the wafers 140a and 140b may be bonded together in some embodiments, as illustrated in FIG. 6. The wafers 140a and 140b may be bonded together in wafer form, chip form, or both wafer and chip form. The wafers 140a and 140b may be bonded together using a suitable wafer bonding technique. Some examples of commonly used bonding techniques for wafer bonding include direct bonding, chemically activated bonding, plasma activated bonding, anodic bonding, eutectic bonding, glass frit bonding, adhesive bonding, thermocompressive bonding, reactive bonding and/or the like. After the semiconductor chips or wafers 140a and 140b are bonded together, the interface between each pair of adjacent semiconductor wafers 140a and 140b may provide an electrically conductive path between the stacked semiconductor wafers 140a and 140b. In accordance with some embodiments, in a direct bonding process, the connection between the adjacent semiconductor wafers 140a and 140b can be implemented using metal-to-metal bonding (e.g., copper-to-copper bonding), dielectric-to-dielectric bonding (e.g., oxide-to-oxide bonding), metal-to-dielectric bonding (e.g., oxide-to-copper bonding), any combinations thereof, and/or the like. In some embodiments, at least two of the adjacent semiconductor wafers 140a and 140b are bonded together using a suitable metal-dielectric bonding technique such as a copper-silicon oxide nitride (Cu—SiON) bonding process, as another example. Only two wafers or chips 140a and 140b are shown in FIG. 6; alternatively, three or more wafers or chips 140a and 140b may be stacked and bonded together to form an image sensor device 100, in accordance with some embodiments.

The through-vias 110 in the through-via region 115a are formed in the insulating material layer 132, the first substrate 102a, the first IMD layer 104a, the second IMD layer 104b, and a portion of the interconnect structure 108 in some embodiments. The etch process for the through-vias 110 may be adapted to stop on a conductive features 106b in the interconnect structure 108 in some embodiments, for example. Some or all of the through-vias 110 may be formed in fewer material layers or more material layers than are illustrated in FIG. 6, for example. The through-vias 110 may comprise a length extending vertically within the image sensor device 100 of about 5 μm to about 15 μm in some embodiments, for example. The length of the through-vias 110 may vary as a function of the pixel pitch size, for example. Alternatively, the length of the through-vias 110 may comprise other dimensions.

The through-vias 110 may be formed in the image sensor device 100 after the bonding process for the semiconductor wafers or chips 140a and 140b, in some embodiments. Trenches for the through-vias 110 can be formed after the bonding process and then filled with a conductive material, such as W, Cu, AlCu, other conductive materials, and/or combinations or multiple layers thereof, as examples. The trenches are lined with about 0.5 μm to about 20 μm of an insulating material (not shown) such as silicon dioxide, SiN, SiON, a carbon-containing layer such as SiC, $Ta_2O_5$, $Al_2O_3$, $HfO_2$, other insulators, or combinations or multiple layers thereof in some embodiments, before forming the conductive material of the through-vias 110.

In other embodiments, portions of the through-vias 110 may be formed before the bonding process during the manufacturing process of each of the semiconductor wafers or chips 140a and 140b. The portions of the through-vias 110 are positioned so that they align after the bonding process for the semiconductor wafers or chips 140a and 140b in these embodiments, for example.

In embodiments wherein the pixel array region 112 includes an array of pixels, a plurality of the photodiodes 130 comprising an array of pixels is formed within the first substrate 102a, as shown in FIG. 6. In some embodiments, a color filter material is formed over the array of pixels, and a lens material is formed over the color filter material. The pixels in the pixel array are adapted to sense images received by the pixel array. The color filter material is adapted to separate light to a red-green-blue (R, G, or B) original element when the image sensor device 100 is utilized as a back side illumination image sensor, for example. The color filter material comprises a photosensitive material in some embodiments, as another example. The lens material may comprise a micro-lens material in some embodiments, as an example. Alternatively, the color filter material and the lens material may comprise other materials. In some embodiments, the color filter material and/or the lens material are not included, and the array region may include other types of devices than pixels and/or photodiodes.

The through-vias 110 in the through-via region 115a and other through-via regions 115b, 115c, and 115d (see FIG. 5) provide vertical electrical connections for the image sensor device 100. The through-vias 110 extend through the first substrate 102a and the first IMD layer 104a to the second IMD layer 104b, in some embodiments. The through-vias 110 may extend within the top wafer 140a, within the top wafer 140a and the next wafer 140b, and/or within the top wafer 140a, wafer 140b, and additional wafers stacked below wafer 140b, not shown. The conductive features 106a and 106b provide horizontal electrical connections for the image sensor device 100, in some embodiments.

A portion of only one image sensor device 100 is shown in the drawings; however, in accordance with some embodiments of the present disclosure, a plurality of image sensor devices 100 may be fabricated on a single wafer and may later be singulated to manufacture a plurality of the image sensor devices 100.

The image sensor device 100 comprises a complementary metal oxide semiconductor (CMOS) image sensor device in some embodiments. In some embodiments, the image sensor device 100 comprises a back side illuminated (BSI) image sensor device 100, wherein images impinge on the top side of the image sensor device 100 in the view shown in FIG. 6, for example. The image sensor device 100 comprises a stacked CMOS image sensor device in some embodiments, as another example.

Figure 7:
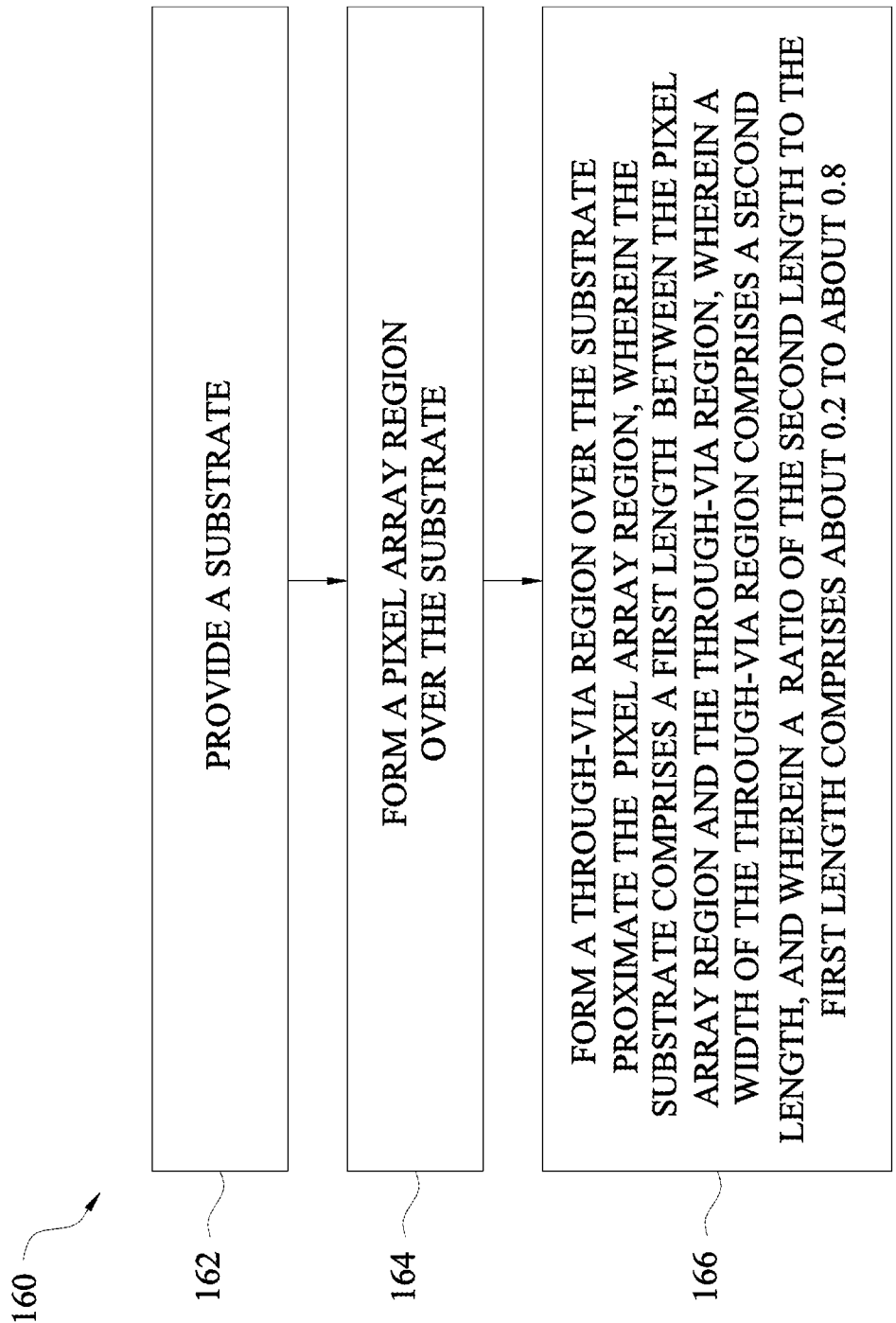
FIG. 7 is a flow chart of a method of manufacturing an image sensor device in accordance with some embodiments.

FIG. 7 is a flow chart 160 of a method of manufacturing an image sensor device 100 in accordance with some embodiments. In step 162, a substrate 102 is provided (see also FIG. 1). In step 164, a pixel array region 112 is formed over the substrate 102. In step 166, a through-via region 115 is formed over the substrate 102 proximate the pixel array region 112. The substrate 102 comprises a first length B2 between the pixel array region 112 and the through-via region 115. A width of the through-via region 115 comprises a second length A2. A ratio A2/B2 of the second length A2 to the first length B2 comprises about 0.2 to about 0.8.

Some embodiments of the present disclosure include design methods for image sensor devices 100. For example, in accordance with some embodiments, a design method for an image sensor device 100 includes first, providing an initial design for an image sensor device 100. The initial design includes a design for a pixel array region 112 and a design for a through-via region 115 disposed proximate the pixel array region 112 (see also FIG. 1). The initial design comprises a first length B2 between the pixel array region 112 and the through-via region 115. The initial design also comprises a second length A2 which comprises a width of the through-via region 115. In accordance with some embodiments, a design method includes analyzing a ratio of the second length A2 and the first length B2. If the ratio A2/B2 is between about 0.2 and about 0.8, the first length B2 and the second length A2 are not changed, and the manufacturing of the image sensor device 100 is begun or is implemented. If the ratio A2/B2 is not between about 0.2 and about 0.8, the initial design is modified to achieve an optimal ratio of the second length A2 and the first length B2. For example, the first length B2 may be changed, the second length A2 may be changed, or both the first length B2 and the second length A2 may be changed.

In some embodiments, modifying the initial design comprises modifying the first length B2, modifying the second length A2, or modifying both the first length B2 and the second length A2. Modifying the first length B2, modifying the second length A2, or modifying both the first length B2 and the second length A2 comprises modifying the first length B2, the second length A2, or both the first length B2 and the second length A2 until the ratio of the second length A2 to the first length B2 comprises about 0.2 to about 0.8. Modifying the initial design comprises modifying both the first length B2 and the second length A2 using an iterative process until the ratio of the second length A2 to the first length B2 comprises about 0.2 to about 0.8 in some embodiments, for example.

In other embodiments, modifying the initial design comprises modifying the first length B2 until the ratio of the second length A2 to the first length B2 comprises about 0.2 to about 0.8. The second length A2 may remain fixed, and the first length B2 may be changed or modified, for example. In yet other embodiments, modifying the initial design comprises modifying the second length A2 until the ratio of the second length A2 to the first length B2 comprises about 0.2 to about 0.8. The first length B2 may remain fixed, and the second length A2 may be changed or modified, as another example.

An example of implementing the novel ratio A2/B2 analysis in accordance with some embodiments of the present disclosure will next be described. An initial design is provided, wherein the length A2 comprising the width of a through-via region 115 (see FIG. 1) comprises about 100 μm. The initial design also has a length B2 comprising the space between an edge of the pixel array region 112 and an edge of the through-via region 115 closest to the pixel array region 112, wherein the length B2 comprises about 110 μm. Calculating the ratio A2/B2 results in a ratio of 0.91, which is outside of the desired range of about 0.2 to about 0.8 for the ratio A2/B2, in accordance with some embodiments of the present disclosure. Thus, the length B2 of the initial design is modified in accordance with some embodiments to be within the desired range for the ratio A2/B2, which results in length B2 being modified to be between about 125 μm (resulting in a ratio A2/B2 of 0.8) to about 500 μm (resulting in a ratio A2/B2 of 0.2).

Advantages of embodiments of the present disclosure include providing novel design methods and manufacturing methods for image sensor devices wherein through-vias are arranged effectively to avoid causing thermal stress to image sensor devices, which are sensitive to thermal stresses from through-vias, and which thermal stresses can cause increased sensor leakage. A clear rule is established herein that defines a relationship between a number of through-vias and a distance of the through-vias from a pixel area of the image sensor devices. Embodiments of the present disclosure provide a distance ratio that avoids spacing apart pixel areas and through-via areas excessively. Using an analysis of the ratios described herein, the through-vias can be arranged in a manner that effectively reduces through-via stress on pixel devices in a pixel array region, without overly sacrificing chip area. Pixel performance is not negatively impacted by reducing spacing using the ratios provided herein, and a cost savings is furthermore achieved. The novel design methods, manufacturing methods, and image sensor devices are also easily implemented in design, manufacturing, and process flows.

In some embodiments, a design method for an image sensor device includes providing an initial design for an image sensor device, the initial design comprising a pixel array region and a through-via region disposed proximate the pixel array region. The initial design comprises a first length between the pixel array region and the through-via region. The initial design comprises a second length comprising a width of the through-via region. The design method includes analyzing a ratio of the second length and the first length, and modifying the initial design to achieve an optimal ratio of the second length and the first length.

In some embodiments, an image sensor device includes a substrate, a pixel array region disposed over the substrate, and a through-via region disposed over the substrate proximate the pixel array region. The substrate comprises a first length between the pixel array region and the through-via region. A width of the through-via region comprises a second length. A ratio of the second length to the first length comprises about 0.2 to about 0.8.

In some embodiments, a method of manufacturing an image sensor device includes providing a substrate, forming a pixel array region over the substrate, and forming a through-via region over the substrate proximate the pixel array region. The substrate comprises a first length between the pixel array region and the through-via region. A width of the through-via region comprises a second length. A ratio of the second length to the first length comprises about 0.2 to about 0.8.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a pixel array region disposed in a substrate; and
a through-via region disposed in the substrate proximate the pixel array region, wherein the substrate comprises:
a first length being a distance from the pixel array region to the through-via region, and
a second length being a width of the through-via region, wherein a ratio of the second length to the first length comprises about 0.2 to about 0.8.

2. The image sensor device according to claim 1, wherein the through-via region includes a plurality of through-vias arranged in a plurality of columns.

3. The image sensor device according to claim 2, wherein the plurality of through-vias comprises a pitch from a center of each of the plurality of through-vias to an adjacent one of the plurality of through-vias.

4. The image sensor device according to claim 3, wherein the second length comprises the pitch times a number of the plurality of columns.

5. The image sensor device according to claim 1, wherein the first length comprises a length of a keep-out zone (KOZ), and wherein no through-vias are disposed in the KOZ.

6. The image sensor device according to claim 1, wherein the through-via region is disposed along one side of the pixel array region.

7. The image sensor device according to claim 1, wherein a through-via region is disposed along each of a plurality of sides of the pixel array region.

8. The image sensor device according to claim 1, wherein the image sensor device comprises a back side image (BSI) sensor device.

9. A method of manufacturing an image sensor device, the method comprising:
forming a pixel array region in a substrate; and
forming a through-via region in the substrate proximate the pixel array region, wherein the substrate comprises:
a first length being a distance from the pixel array region to the through-via region,
a second length being a width of the through-via region, wherein a ratio of the second length to the first length comprises about 0.2 to about 0.8.

10. The method according to claim 9, wherein forming the pixel array region comprises forming a plurality of photodiodes arranged in an array, and wherein forming the through-via region comprises forming a plurality of through-vias arranged in a plurality of columns.

11. The method according to claim 9, further comprising forming an inter-metal dielectric (IMD) layer over the substrate.

12. The method according to claim 11, wherein providing the substrate comprises providing a first substrate, wherein forming the IMD layer comprises forming a first IMD layer, and wherein the method further comprises:
providing a second substrate;
forming a second IMD layer over the second substrate; and
coupling the second IMD layer to the first IMD layer, and wherein forming the through-via region comprises forming a plurality of through-vias that extend through the first substrate and the first IMD layer to the second IMD layer.

13. A method of manufacturing an image sensor device, comprising:
forming a plurality of photodiodes in a pixel array region of a first substrate;
forming a plurality of through-vias in a through-vias region, the plurality of through-vias extending through the first substrate, the through-vias region having a first length; and
forming an intermediate region between the pixel array region and the through-vias region, the intermediate region having a second length extending between the pixel array region and the through-vias region;
wherein a ratio of the first length to the second length comprises about 0.2 to about 0.8.

14. The method according to claim 13, wherein forming the plurality of photodiodes comprises forming the plurality of photodiodes in an array.

15. The method according to claim 13, wherein forming the plurality of through-vias comprises forming the plurality of through-vias in a plurality of rows or columns.

16. The method according to claim 13, further comprising forming an inter-metal dielectric (IMD) layer over the first substrate.

17. The method according to claim 13, wherein the first substrate comprises a first inter-metal dielectric (IMD) layer over a semiconductor substrate, and further comprises:
   forming a second IMD layer over a second substrate; and
   coupling the second IMD layer to the first IMD layer.

18. The method according to claim 17, wherein the plurality of through-vias extend through the first substrate and the first IMD layer to the second IMD layer.

19. The method according to claim 13, further comprising coupling the first substrate to a second substrate.

20. The image sensor device of claim 1, wherein the substrate is associated with a first wafer, the image sensor device further comprising a second wafer, wherein the first wafer is directly bonded to the second wafer, wherein through-vias of the through via region of the first wafer traverse an entirety of the first wafer and continuously extend into the second wafer.

* * * * *